(12) United States Patent
Yu

(10) Patent No.: US 7,289,324 B2
(45) Date of Patent: Oct. 30, 2007

(54) HEAT DISSIPATION DEVICE HAVING POWER WIRES FIXTURE

(75) Inventor: Fang-Xiang Yu, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,645

(22) Filed: Apr. 17, 2006

(65) Prior Publication Data

US 2007/0058345 A1 Mar. 15, 2007

(30) Foreign Application Priority Data

Sep. 9, 2005 (CN) .................. 2005 1 0037239

(51) Int. Cl.
*H05K 7/20* (2006.01)

(52) U.S. Cl. .................. 361/697; 361/695; 361/724; 361/687; 361/710; 439/501; 165/80.3; 165/185; 165/121; 248/510; 248/694; 24/16 R; 24/17 AP; 257/E23.099; 257/718; 257/E23.086; 174/40 CC; 174/54; 174/61

(58) Field of Classification Search .................. 361/697, 361/695, 710, 752; 174/61, 54, 40 CC; 24/16 R; 439/246–248, 378, 485, 501; 165/80.3; 454/184; 257/E23.099, 718, 719, 722; 248/510; 415/213.1, 415/175, 178

See application file for complete search history.

(56) References Cited

U.S. PATENT DOCUMENTS

| 5,142,442 | A  | * | 8/1992  | Daniels et al. | ............. | 361/687 |
| 5,960,862 | A  | * | 10/1999 | Hu             | ............. | 165/80.3 |
| 6,193,205 | B1 | * | 2/2001  | Wang           | ............. | 248/510 |
| 6,401,305 | B1 | * | 6/2002  | Joseph         | ............. | 24/16 R |
| 6,427,290 | B1 | * | 8/2002  | Liu            | ............. | 24/16 R |
| 6,600,650 | B1 | * | 7/2003  | Lee            | ............. | 361/697 |
| 6,667,884 | B1 | * | 12/2003 | Lee et al.     | ............. | 361/697 |
| 2005/0225939 | A1 | * | 10/2005 | Otsuki et al. | ............. | 361/695 |
| 2006/0042787 | A1 | * | 3/2006  | Yu et al.      | ............. | 165/185 |
| 2006/0120055 | A1 | * | 6/2006  | Yu et al.      | ............. | 361/710 |
| 2007/0032126 | A1 | * | 2/2007  | Yu             | ............. | 439/501 |

* cited by examiner

*Primary Examiner*—Boris Chervinsky
*Assistant Examiner*—Courtney Smith
(74) *Attorney, Agent, or Firm*—Winston Hsu

(57) ABSTRACT

A wire fixture (27) is for fastening power wires (246) of a heat-dissipating fan (24) to a supporting surface of a heat dissipation device (20). The heat dissipation device is for dissipating heat from a heat-generating electronic component. The wire fixture includes a catching portion (278) for being attached to an end of the supporting surface, a fixing portion (272) disposed with adhesive thereon, for being fixed to an opposite end of the supporting surface, and a covering portion (276) formed between the catching portion and the fixing portion and being without adhesive spread thereon, for urging the power wires of the heat dissipating fan to the supporting surface. The catching portion is without adhesive thereon.

18 Claims, 3 Drawing Sheets

HEAT DISSIPATION DEVICE HAVING POWER WIRES FIXTURE

CROSS-REFERENCES TO RELATED APPLICATION

This application is related to co-pending U.S. patent application Ser. No. 11/308,115, filed on Mar. 7, 2006, assigned to the same assignee as this application, and entitled "HEAT DISSIPATION DEVICE HAVING POWER WIRES FIXTURE". The disclosure of the above-identified co-pending application is incorporated herein by reference.

FIELD OF THE INVENTION

The present invention relates generally to a heat dissipation device, and particularly to a heat dissipation device having a fixture for attaching power wires of a heat dissipating fan of the heat dissipation device to a heat sink thereof.

DESCRIPTION OF RELATED ART

A heat dissipation apparatus always includes a heat dissipating fan. In transportation of the heat dissipation apparatus, power wires of the heat dissipating fan needs to be fixed to the heat dissipation apparatus, for facilitating handling of the heat dissipation apparatus during the transportation.

In nowadays, the wires are usually wrapped into a coil which is fixed to the heat dissipation apparatus by a tape with adhesive coated wholly on one of two major surfaces thereof. In fixation of the wires, a middle portion of the tape is adhered to the wires. Then, the wires and the tape are positioned on the heat dissipation apparatus, with two ends of the tape being adhered to the heat dissipation apparatus. Thus, the wires of the heat-dissipating fan are fixed to the heat dissipation apparatus.

In the heat dissipation apparatus, some of the adhesive still sticks to the wires after the tape is peeled off the heat dissipation apparatus. The remained adhesive on the wires may deteriorate the appearance of the wires and contaminate the wires with dusts and dirt. In conventional operation, the remained adhesive needs to be removed from the wires before the heat dissipation apparatus is mounted in a computer, which decreases disassembly efficiency of the heat dissipation apparatus in the computer. Thus, a fixture which can secure power wires of a fan of a heat dissipation apparatus at a fixed position during transportation of the heat dissipation apparatus, and which does not leave adhesive on the wires when the fixture is removed from the wires to release the wires is needed.

SUMMARY OF INVENTION

The present invention relates to a wire fixture for fastening power wires of a heat-dissipating fan to a supporting surface of a heat dissipation device. The heat dissipation device is for dissipating heat from a heat-generating electronic component. The wire fixture includes a catching portion for being attached to an end of the supporting surface, a fixing portion disposed with adhesive thereon, for being fixed to an opposite end of the supporting surface, and a covering portion formed between the catching portion and the fixing portion and being without adhesive spread thereon, for urging the power wires of the heat dissipating fan to the supporting surface, whereby the wires are fixed in position by the wire fixture before the wire fixture is peeled from the supporting surface of the heat dissipation apparatus. The catching portion is without adhesive thereon.

Other advantages and novel features of the present invention will become more apparent from the following detailed description of preferred embodiment when taken in conjunction with the accompanying drawings, in which:

DETAILED DESCRIPTION

Figure 1:
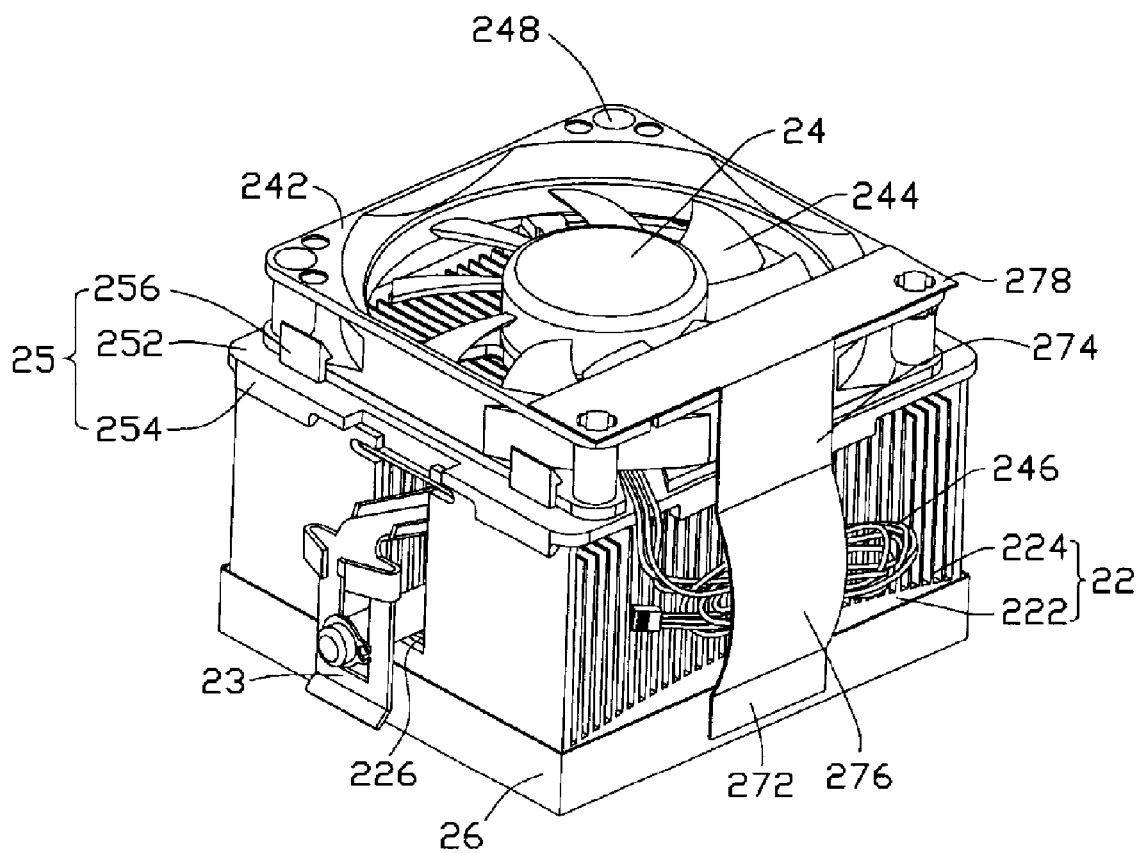
FIG. 1 is an assembled view of a heat dissipation apparatus according to a preferred embodiment of the present invention.
Figure 2:
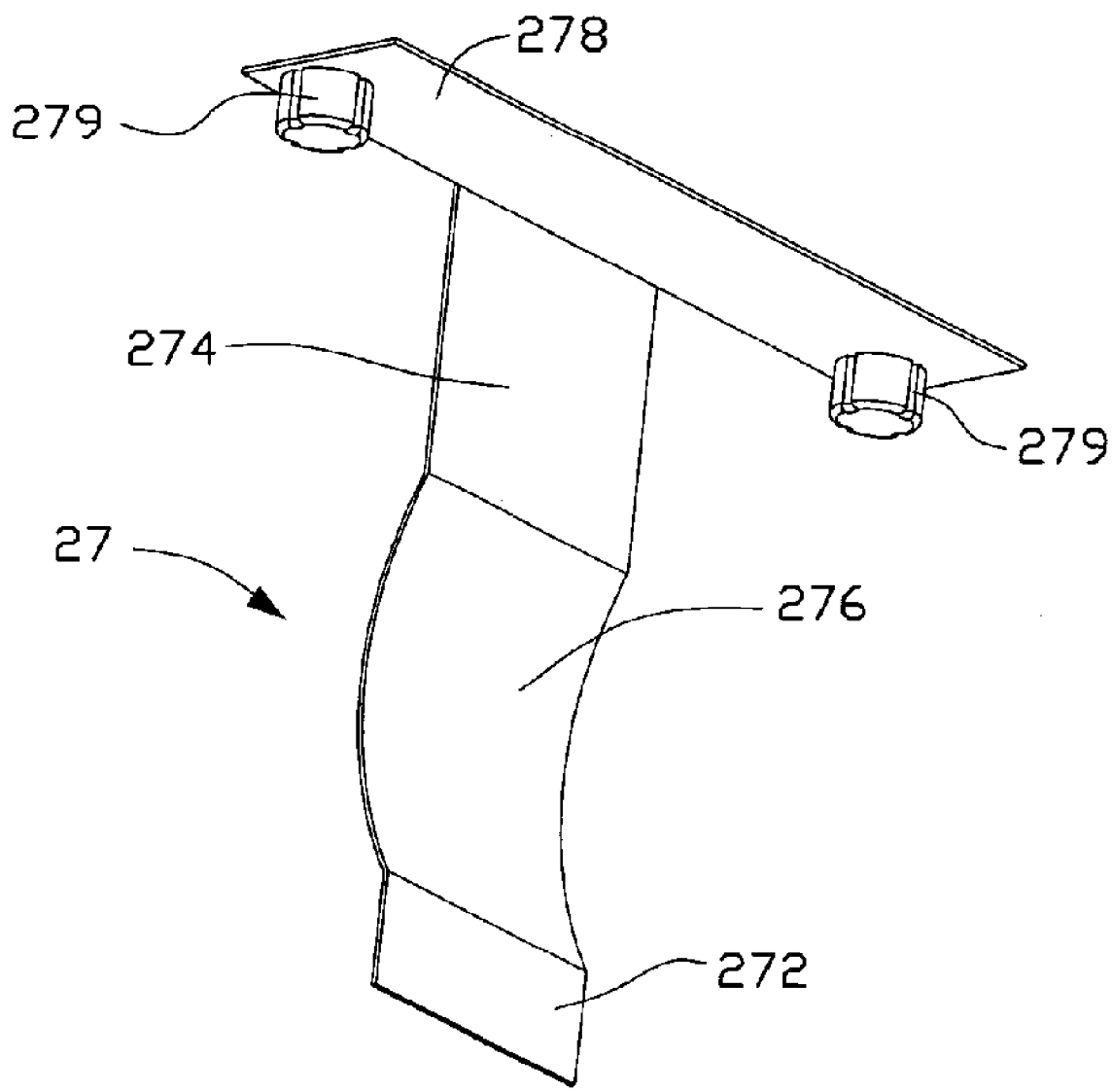
FIG. 2 is an isometric view of a power wire fixture of the heat dissipation apparatus of FIG. 1.

Referring to FIG. 1, a heat dissipation apparatus 20 for timely removing heat generated by a heat-generating electronic component (not shown) includes a heat sink 22, a clip 23, a heat-dissipating fan 24, a bracket 25, a grease protecting cover 26 and a wire fixture 27 (FIG. 2).

The heat sink 22 includes a rectangular shaped base 222, and a plurality of fins 224 mounted on the base 222. A bottom surface of the base 222 spreads a layer of thermal grease (not shown) thereon, for benefiting a thermally contact between the heat sink 22 and the heat-generating electronic component. The grease protecting cover 26 is intimately attached to the base 222 of the heat sink 22 for isolating the thermal grease from surrounding articles such as dusts and dirt, thereby preventing the thermal grease from being contaminated by the surrounding articles. A channel 226 extending through the fins 224 is defined at a middle portion of the heat sink 22. The clip 23 is received in the channel 226 of the heat sink 22 for mounting the heat sink 22 onto the heat-generating electronic component.

The heat-dissipating fan 24 is mounted on the heat sink 22, for driving airflows to pass through the heat sink 22 to take away heat therefrom. The heat-dissipating fan 24 includes a rectangular shaped frame 242, an impeller 244 disposed in the frame 242 for providing the airflows, and a group of power wires 246. The frame 242 defines four through holes 248 at corners thereof.

The bracket 25 is sandwiched between the heat sink 22 and the heat-dissipating fan 24, for mounting the heat-dissipating fan 24 onto the heat sink 22. The bracket 25 includes a rectangular shaped main body 252, four clutches 254 extending downwardly near four corners of the main body 252, and four clasps 256 extending upwardly near four corners of the main body 252. The clutches 254 are fastened to two outside fins 224 of the heat sink 22 to mount the bracket 25 onto the heat sink 22. The clasps 256 catch a bottom edge of the heat-dissipating fan 24 to secure the heat-dissipating fan 24 to the bracket 25, thereby mounting the heat-dissipating fan 24 to the heat sink 22.

Also referring to FIG. 2, the wire fixture 27 is attached to the heat-dissipating fan 24 and the grease protecting cover 26, for attaching power wires 246 of the heat-dissipating fan 24 to the heat dissipation apparatus 20. The wire fixture 27 is made of elastic material, and includes a fixing portion 272, a connecting portion 274, a covering portion 276 formed between the connecting portion 274 and the fixing portion 272, and a catching portion 278 perpendicularly extending from a top end of the connecting portion 274. The catching portion 278 has a strip-shaped configuration, and includes two poles 279 protruding downwardly from two ends thereof. The poles 279 perpendicularly extend from a bottom surface of the catching portion 278 toward the connecting portion 274. A diameter of each pole 279 of the catching portion 278 is substantially similar to a diameter of each through hole 248 of the heat-dissipating fan 24, so that the poles 279 can be engagingly received in the corresponding through holes 248 of the heat-dissipating fan 24, thereby attaching a top end of the wire fixture 27 to the heat dissipation apparatus 20. A layer of adhesive (not shown) is spread on the fixing portion 272, for attaching a bottom end of the wire fixture 27 to the heat dissipation apparatus 20. The connecting portion 274 contacts with a sidewall of the heat-dissipating fan 24, with a bottom end thereof intimately contacting with a top of one side of the heat sink 22. The covering portion 276 is arc shaped, and does not have adhesive spread thereon. The covering portion 276 is for sandwiching the wires 246 of the heat-dissipating fan 24 between the wire fixture 27 and the heat sink 22 and urging the wires 246 against the heat sink 22.

In assembly of the heat dissipation apparatus 20, the grease protecting cover 26 is attached to the base 222 of the heat sink 22 to receive the thermal grease in an inner space of the grease protecting cover 26 thereby to protect the thermal grease from contamination. The clip 23 is disposed in the channel 226 of the heat sink 22, with two ends thereof extending beyond the grease protecting cover 26. The bracket 25 is mounted to and depressed toward the heat sink 22 until the clutches 254 attach the bracket 25 onto the heat sink 22. The heat-dissipating fan 24 is mounted on and pressed downwardly toward the bracket 25 until the heat-dissipating fan 24 is caught by the clasps 256. The poles 279 of the catching portion 278 are inserted into the corresponding through holes 248 of the heat-dissipating fan 24, thereby attaching the top end of the wire fixture 27 to the heat dissipation apparatus 20. The wires 246 of the heat-dissipating fan 24 are coiled and put on the side of the heat sink 22 below the connecting portion 274 of the wire fixture 27. Finally, the fixing portion 272 is brought downwardly to be adhered to a side of the grease protecting cover 26 below the wires 246 whereby the wires 242 are sandwiched between the covering portion 276 of the wire fixture 27 and the fins 224 of the heat sink 22. Thus, the wires 246 are attached to the side of the heat sink 22. The wire fixture 27 is resilient so it exerts a resilient force to the wires 246 to tightly secure the wires 246 of the heat-dissipating fan 24 against the fins 224 at the side of the heat sink 22. Thus, the assembly of the heat dissipation apparatus 20 is accomplished.

In use of the heat dissipation apparatus 20, a drag force is exerted on the covering portion 276 of the wire fixture 27 to pull the fixing portion 272 of the wire fixture 27 off the heat dissipation apparatus 20. A pull is then exerted upwardly on the catching portion 278 of the wire fixture 27 to pull the catching portion 278 of the wire fixture 27 off the heat dissipation apparatus 20. So the wire fixture 27 is detached from the heat dissipation apparatus 20, and the power wires 246 of the heat-dissipating fan 24 is released from the fixed position and can be extended to connect with a power socket (not shown). Then, the heat sink 22 is mounted on the heat-generating electronic component with the clip 23 fastened to a retention module (not shown) surrounding the electronic component, and the power wires 246 are brought to connect with the power socket to drive the fan 24 to rotate.

In the present invention, corresponding surfaces of the grease protecting cover 26, the heat sink 22, the bracket 25, and the heat-dissipating fan 24 form a supporting surface of the heat dissipation apparatus 20 for supporting the wire fixture 27 and the coiled power wires 246. The power wires 246 of the heat-dissipating fan 24 are sandwiched between the covering portion 276 of the wire fixture 27 and the supporting surface of the heat dissipation apparatus 20 via the covering portion 276. The covering portion 276 of the wire fixture 27 contacts with the wires 246 of heat-dissipating fan 24 without adhesive spread thereon. Thus, there will be no adhesive adhered to the wires 246 of the heat-dissipating fan 24 after the wire fixture 27 is peeled off the supporting surface of the heat dissipation apparatus 20. Thus, the wires 246 of the heat-dissipating fan 24 will not be contaminated with dusts and dirt. It is not necessary to clean the wires 246 after the wires 246 are detached from the heat sink 22. Accordingly, the efficiency of mounting of the heat dissipation apparatus 20 to the heat-generating electronic component is increased, in comparison with the conventional art.

In the assembly of the heat dissipation apparatus 20, the fixing portion 272 of the wire fixture 27 is attached to the side of the grease protecting cover 26. Alternatively, the fixing portion 272 of the wire fixture 27 may also be attached to other parts of the heat dissipation apparatus 20, such as the base 222 or the fins 224 of the heat sink 22. In an alternative option of the present invention, the wire fixture 27 can exclude the connecting portion 274, making the catching portion 278 directly perpendicularly extending from a top end of the covering portion 276. In this case, a length of the covering portion 276 needs to be increased.

Figure 3:
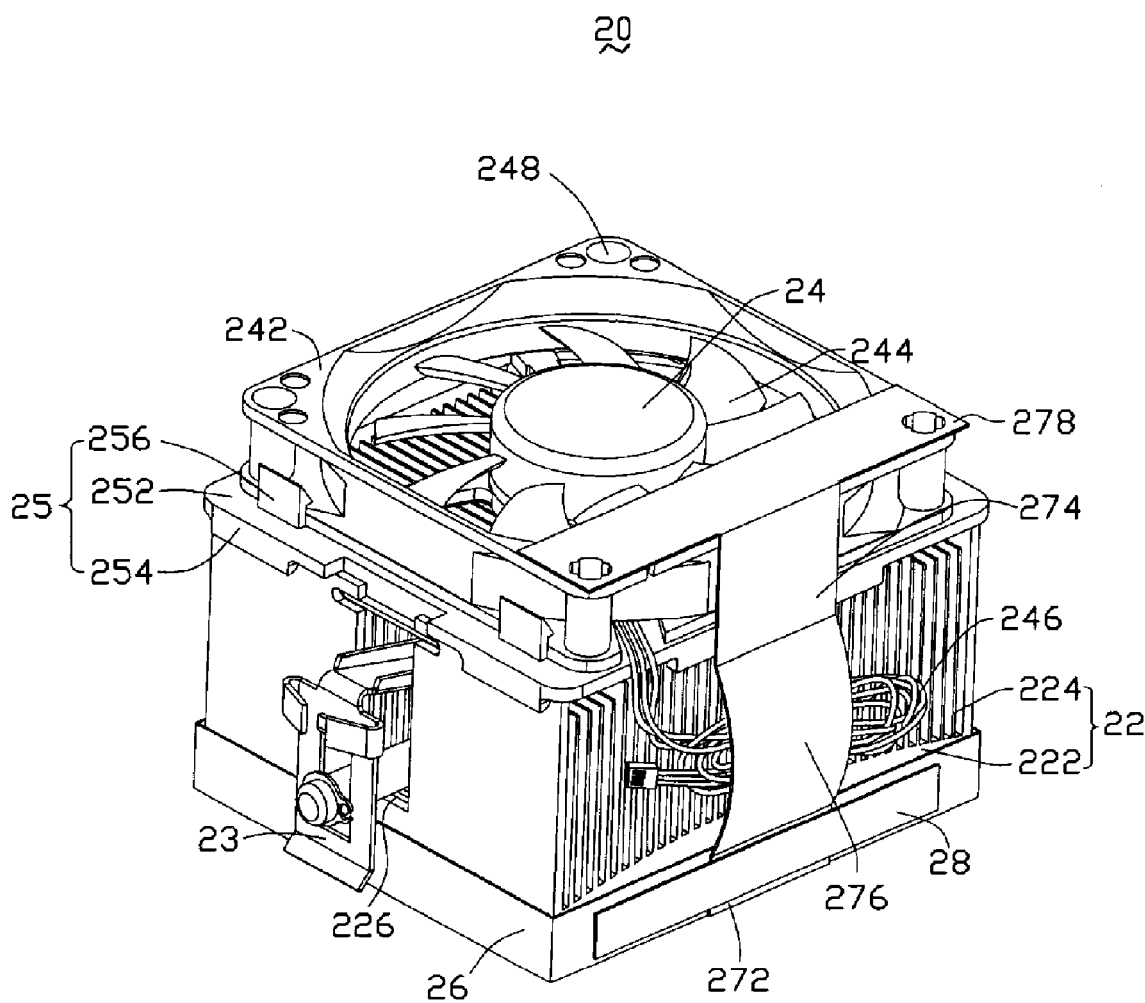
FIG. 3 is an assembled view of a heat dissipation apparatus according to another embodiment of the present invention.

Referring to FIG. 3, an assembled view of a heat dissipation apparatus according to another embodiment of the present invention is shown. In this embodiment, the fixing portion 272 of the wire fixture 27 does not spread adhesive thereon. The fixing portion 272 of the wire fixture 27 is attached to the supporting surface of the heat dissipation apparatus 20 via an adhesive tape 28.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A wire fixture configured for fastening power wires of a heat-dissipating fan to a supporting surface of a heat dissipation device, the heat dissipation device being for dissipating heat from a heat-generating electronic component, the wire fixture comprising:

a catching portion configured for being attached to an end of the supporting surface, the catching portion being without adhesive thereon; wherein the heat dissipating fan defines a plurality of through holes therein, and the catching portion comprises a plurality of poles engaged in the through holes, a fixing portion disposed with adhesive thereon, configured for being fixed to an opposite end of the supporting surface; and a covering portion formed between the catching portion and the fixing portion and being without adhesive spread thereon, configured for urging the power wires of the heat dissipating fan to the supporting surface.

2. The wire fixture as described in claim 1, further comprising a connecting portion formed between the covering portion and the catching portion, the connecting portion comprising an adjacent end to the covering portion intimately contacting with the supporting surface.

3. The wire fixture as described in claim 1, wherein the wire fixture is made of elastic material.

4. The wire fixture as described in claim 1, wherein the supporting surface is formed by sidewalls of the heat-dissipating fan and a grease protecting cover and a heat sink on the grease protecting cover, the heat-dissipating fan being mounted on the heat sink.

5. The wire fixture as described in claim 3, wherein the fixing portion of the wire fixture is fixed to one of the grease protecting cover and the heat sink, the catching portion of the wire fixture is attached to the heat-dissipating fan.

6. A wire fixture configured for fastening power wires of a heat-dissipating fan to a heat dissipation device, the heat dissipation device being for dissipating heat from a heat-generating electronic component, the wire fixture comprising:
   a catching portion configured for engaging an end of the wire fixture to the heat-dissipating fan, the catching portion being without adhesive thereon; wherein the heat dissipating fan defines a plurality of holes therein, the catching portion extending a plurality of poles therefrom, the poles being engaged in the through holes for attaching the end of the wire fixture to the heat dissipating fan,
   a covering portion disposed below the catching portion configured for sandwiching the wires of the heat-dissipating fan between the wire fixture and the heat dissipation device; and
   a fixing portion configured for attaching an opposite end of the wire fixture to the heat dissipation device below the wires.

7. The wire fixture as described in claim 6, wherein the fixing portion is disposed with adhesive thereon for fixing the opposite end of the wire fixture to the heat-dissipating fan.

8. The wire fixture as described in claim 6, wherein the fixing portion is fixed to the heat dissipation device via an adhesive tape.

9. The wire fixture as described in claim 6, wherein the wire fixture further comprises a connecting portion formed between the covering portion and the catching portion, the connecting portion comprises an adjacent end to the covering portion intimately contacting with the heat dissipation device.

10. The wire fixture as described in claim 6, wherein the wire fixture is made of elastic material.

11. The wire fixture as described in claim 6, wherein a heat sink is disposed below the heat-dissipating fan, with a grease protecting cover disposed at a bottom portion thereof, the fixing portion is attached to a side of the grease protecting cover.

12. The wire fixture as described in claim 11, wherein a bracket is sandwiched between the heat-dissipating fan and the heat sink, for mounting the heat-dissipating fan onto the heat sink.

13. The wire fixture as described in claim 12, wherein the heat-dissipating fan is mounted to the heat sink via a plurality of clutches and clasps extending from the bracket and respectively engaging with the heat sink and the fan.

14. A heat dissipation apparatus comprising:
   a heat sink;
   a fan mounted on the heat sink and comprising a power wire; and
   a wire fixture having an upper portion comprising a pole engaging in the fan,
   a lower portion attached to the heat sink by adhesive and a middle portion located between the upper and lower portions and urging the power wire against the heat sink.

15. The heat dissipation apparatus as described in claim 14, wherein the heat sink has a grease protecting cover attached to a base thereof, and the lower portion of the wire fixture is attached to the grease protecting cover.

16. The heat dissipation apparatus as described in claim 15, wherein the middle portion has an arc-shaped configuration.

17. The heat dissipation apparatus as described in claim 16, wherein the pole is engaged in a hole defined in a corner of the fan.

18. The heat dissipation apparatus as described in claim 17, wherein the upper portion has a catching portion and a connecting portion, the connecting portion interconnecting the catching portion and the middle portion, the catching portion extending perpendicularly from a top of the connecting portion and the pole being formed on a bottom face of the catching portion and extending downwardly therefrom.

* * * * *